(12) United States Patent
Gopalan et al.

(10) Patent No.: US 9,938,149 B1
(45) Date of Patent: Apr. 10, 2018

(54) DEGRADABLE CONJUGATED POLYMERS FOR THE SELECTIVE SORTING OF SEMICONDUCTING CARBON NANOTUBES

(71) Applicant: Wisconsin Alumni Research Foundation, Madison, WI (US)

(72) Inventors: Padma Gopalan, Madison, WI (US); Michael Scott Arnold, Middleton, WI (US); Catherine Kanimozhi Kansiusarulsamy, Madison, WI (US); Gerald Joseph Brady, Madison, WI (US); Matthew John Shea, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/291,508

(22) Filed: Oct. 12, 2016

(51) Int. Cl.
  *C01B 31/02* (2006.01)
  *C08G 73/06* (2006.01)
  *H01L 51/00* (2006.01)
(52) U.S. Cl.
  CPC ........ *C01B 31/026* (2013.01); *C08G 73/0627* (2013.01); *C01B 2202/02* (2013.01); *C01B 2202/22* (2013.01); *H01L 51/0048* (2013.01)
(58) Field of Classification Search
  CPC .............. C01B 31/026; C01B 2202/22; C01B 2202/02; C01B 240/00; C01B 32/17; C01B 32/172; C08G 23/0627
  See application file for complete search history.

(56) References Cited

U.S. PATENT DOCUMENTS 9,327,979 B1  5/2016  Gopalan et al.

OTHER PUBLICATIONS

Brady, Gerald J., et al. "High performance transistors via aligned polyfluorene-sorted carbon nanotubes." Applied Physics Letters 104.8 (2014): 083107.*
Ms, El-Hayek, et al. "Characterization of s-SWCNT/PF-PD Dispersions and Networks." (2016).*
Lei et al., Removable and Recyclable Conjugated Polymers for Highly Selective and High-Yield Dispersion and Release of Low-Cost Carbon Nanotubes, J. Am. Chem. Soc. 2016, 138, Jan. 5, 2016, pp. 802-805.
Toshimitsu et al., Semiconducting single-walled carbon nanotubes sorting with a removable solubilizer based on dynamic supramolecular coordination chemistry, Nature Communications, 5:5041, DOI: 10.1038/ncomms6041, Oct. 3, 2014.
Joo et al., Isolation of Pristine Electronics Grade Semiconducting Carbon Nanotubes by Switching the Rigidity of the Wrapping Polymer Backbone on Demand, ACS Nano, vol. 9, No. 10, Sep. 8, 2015, pp. 10203-10213.

(Continued)

*Primary Examiner* — Richard M Rump
(74) *Attorney, Agent, or Firm* — Bell & Manning, LLC

(57) ABSTRACT

Conjugated polymers composed of bi-pyridine units linked to 9,9-dialkyl fluorenyl-2,7-diyl units via imine linkages along the polymer backbone are provided. Also provided are semiconducting single-walled carbon nanotubes coated with the conjugated polymers and methods of sorting and separating s-SWCNTs from a sample comprising a mixture of s-SWCNTs and metallic single-walled carbon nanotubes using the conjugated polymers.

17 Claims, 15 Drawing Sheets

(56) References Cited

OTHER PUBLICATIONS

Pochorovski et al., H-Bonded Supramolecular Polymer for the Selective Dispersion and Subsequent Release of Large-Diameter Semiconducting Single-Walled Carbon Nanotubes, J. Am. Chem. Soc. 2015, 137, Mar. 27, 2015, pp. 4328-4331.
Gerstel et al., Highly Selective Dispersion of Single-Walled Carbon Nanotubes via Polymer Wrapping: A Combinatorial Study via Modular Conjugation, ACS Macro Lett. 2014, 3, Dec. 11, 2013, pp. 10-15.
Brady et al., High performance transistors via aligned polyfluorene-sorted carbon nanotubes, Applied Physics Letters 104, 083107, Feb. 25, 2014, pp. 1-5.
Nish et al., Highly selective dispersion of single-walled carbon nanotubes using aromatic polymers, Nature nanotechnology 2, Sep. 16, 2007, pp. 640-646.
Wang et al., Degradable Conjugated Polymers: Synthesis and Applications in Enrichment of Semiconducting Single?Walled Carbon Nanotubes, Advanced Functional Materials 21, 2011, pp. 1643-1651.
Bindl et al., Enhancing extraction of photogenerated excitons from semiconducting carbon nanotube films as photocurrent, Chemical Physics 413, Aug. 8, 2012, pp. 29-34.
Wang et al., Design and Synthesis of Metal Ion-Recognition-Induced Conjugated Polymers: An Approach to Metal Ion Sensory Materials, J. Am. Chem. Soc. 119, 1997, pp. 12-21.
Irving et al., The stability of transition-metal complexes, Journal of Chemical Society, Jan. 1, 1953, pp. 3192-3210.
Mistry et al., High-Yield Dispersions of Large-Diameter Semiconducting Single-Walled Carbon Nanotubes with Tunable Narrow Chirality Distributions, ACS nano 7, No. 3, Feb. 4, 2013, pp. 2231-2239.
Park et al. Highly effective separation of semiconducting carbon nanotubes verified via short-channel devices fabricated using dip-pen nanolithography, ACS Nano, vol. 6, No. 3, Feb. 21, 2012, pp. 2487-2496.
Arnold et al., Sorting carbon nanotubes by electronic structure using density differentiation, Nature Nanotechnology, vol. 1, Oct. 4, 2016, pp. 60-65.
Subbaiyan et al., Benchtop aqueous two-phase extraction of isolated individual single-walled carbon nanotubes, Nano Research, DOI: 10.1007/s12274-014-0680-z, Dec. 8, 2014.
Brady et al., Polyfluorene-Sorted, Carbon Nanotube Array Field-Effect Transistors with Increased Current Density and High On/Off Ratio, ACS Nano, vol. 8, No. 11, Nov. 10, 2014, pp. 11614-11621.
Berton et al., Influence of molecular weight on selective oligomer-assisted dispersion of single-walled carbon nanotubes and subsequent polymer exchange, Chem. Commun., 48, Jan. 12, 2012, pp. 2516-2518.
Liang et al., Selective and Reversible Noncovalent Functionalization of Single-Walled Carbon Nanotubes by a pH-Responsive Vinylogous Tetrathiafulvalene-Fluorene Copolymer, J. Am. Chem. Soc., 136, Dec. 26, 2013, pp. 970-977.
Imin et al., The effect of molecular weight on the supramolecular interaction between a conjugated polymer and single-walled carbon nanotubes, Polym. Chem., 2, Apr. 6, 2011, pp. 1404-1408.
Shea et al., Experimental Measurement of the Binding Configuration and Coverage of Chirality-Sorting Polyfluorenes on Carbon Nanotubes, J. Phys. Chem. Lett., 5, Oct. 9, 2014, pp. 3742-3749.

\* cited by examiner

DEGRADABLE CONJUGATED POLYMERS FOR THE SELECTIVE SORTING OF SEMICONDUCTING CARBON NANOTUBES

REFERENCE TO GOVERNMENT RIGHTS

This invention was made with government support under DE-SC0002148 awarded by the US Department of Energy; W911NF-12-1-0025 awarded by the US Army/ARO, and 1462771 awarded by the National Science Foundation. The government has certain rights in the invention.

BACKGROUND

Single-walled carbon nanotubes (SWCNTs) have exceptional electronic properties that enable a plethora of semiconducting applications such as field-effect transistors (FETs), photovoltaics (PVs), and gas sensors. In order to implement SWCNTs as the semiconducting material in electronic devices, it is important to purify and sort out the desirable semiconducting SWCNTs (s-SWCNTs) from as-synthesized electronically heterogeneous SWCNT mixtures. This challenge in synthetic heterogeneity has motivated researchers to develop a number of sorting techniques, such as density gradient ultracentrifugation, aqueous two-phase separation, and polymer wrapping. Among these methods for sorting s-SWCNTs, polymer wrapping is perhaps the most efficient and potentially the most effective at selectively isolating pure s-SWCNTs. In particular, conjugated polyfluorene polymers are useful materials that have π-π interactions with a high degree of s-SWCNT selectivity based on chirality, diameter and electronic type. However, a considerable challenge that has yet to be fully addressed is the removal of the remaining polymer chains attached to the sidewalls of s-SWCNTs after sorting, which result in high inter-tube energetic barriers and inferior s-SWCNT network connections.

SUMMARY

Conjugated polymers composed of bi-pyridine units linked to 9,9-dialkyl fluorenyl-2,7-diyl units via imine linkages along the polymer backbone are provided. Also provided are s-SWCNTs coated with the conjugated polymers and methods of sorting and separating s-SWCNTs from a sample comprising a mixture of s-SWCNTs and metallic single-walled carbon nanotubes (m-SWCNTs) using the conjugated polymers.

One embodiment of a conjugated polymer has the structure:

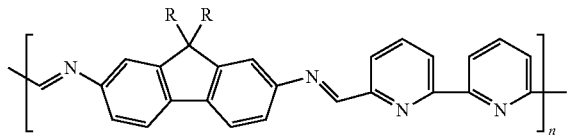

where R represents a functional group comprising an alkyl chain and n represents the number of repeat units in the conjugated polymer.

One embodiment of a method for separating semiconducting single-walled carbon nanotubes from a starting carbon nanotube sample comprising a mixture of semiconducting single-walled carbon nanotubes and metallic single-walled carbon nanotubes comprises the steps of: (a) forming a solution comprising the carbon nanotube sample and a conjugated polymer having the structure:

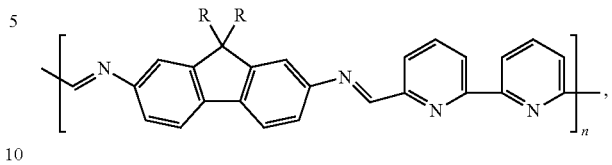

where R represents a functional group comprising an alkyl chain and n represents the number of repeat units in the conjugated polymer, wherein the conjugated polymer preferentially coats and disperses the semiconducting single-walled carbon nanotubes, relative to the metallic single-walled carbon nanotubes, in the solution; and (b) separating the dispersed single-walled carbon nanotubes from the undispersed single-walled carbon nanotubes to obtain a purified carbon nanotube sample, wherein the purified carbon nanotube sample has a higher ratio of semiconducting single-walled carbon nanotubes to metallic single-walled carbon nanotubes than did the starting carbon nanotube sample. The conjugated polymer coating can then be removed from the separated single-walled carbon nanotubes by depolymerizing the conjugated polymer with acid, heat, or a combination of acid and heat.

Another embodiment of a method for separating semiconducting single-walled carbon nanotubes from a starting carbon nanotube sample comprising a mixture of semiconducting single-walled carbon nanotubes and metallic single-walled carbon nanotubes comprises the steps of: (a) forming a solution comprising the carbon nanotube sample and a conjugated polymer having imine linkages along its polymer backbone chain, wherein the conjugated polymer preferentially coats and disperses the semiconducting single-walled carbon nanotubes, relative to the metallic single-walled carbon nanotubes, in the solution; (b) separating the dispersed single-walled carbon nanotubes from the undispersed single-walled carbon nanotubes to obtain a purified carbon nanotube sample, wherein the purified carbon nanotube sample has a higher ratio of semiconducting single-walled carbon nanotubes to metallic single-walled carbon nanotubes than did the starting carbon nanotube sample; and (c) heating the conjugated polymer-coated semiconducting single-walled carbon nanotubes to a temperature at which the conjugated polymer thermally decomposes, whereby at least 60 percent, by weight, of the coating of the conjugated polymer is removed from the semiconducting single-walled carbon nanotubes.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
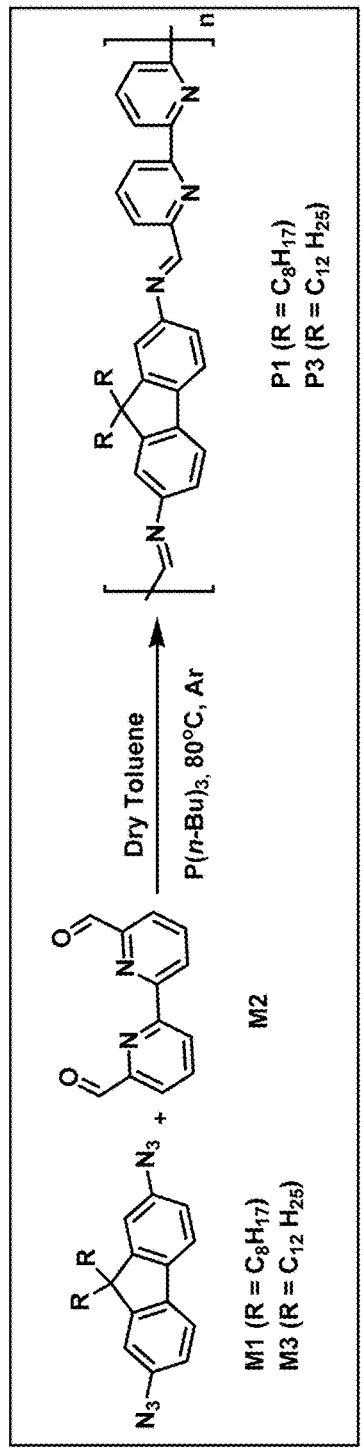
FIG. 1 depicts a general procedure for the polymerization of P1 and P3 (as defined in the Example).

Conjugated polymers composed of bi-pyridine (BPy) units linked to 9,9-dialkyl fluorenyl-2,7-diyl units via imine linkages along the polymer backbone are provided. Also provided are s-SWCNTs coated (also referred to as "wrapped") with the conjugated polymers and methods of sorting and separating s-SWCNTs from a sample comprising a mixture of s-SWCNTs and metallic single-walled carbon nanotubes (m-SWCNTs) using the conjugated polymers.

The conjugated polymer, which is referred to as PFO-N-BPy, has the following structure:

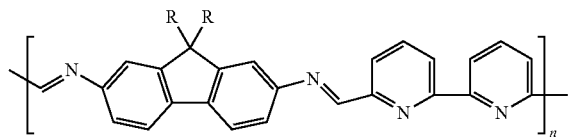

where R represents a functional group that consists of or includes an alkyl chain having the structure $C_xH_{(2x+1)}$, wherein x represents the number of carbon atoms in the alkyl chain and n represents the number of repeat units in the polymer backbone chain. By way of illustration, in some embodiments of the polymers x has a value in the range from 6 to 20, inclusive. The conjugated polymer can be synthesized in accordance with the methods presented in the Example.

Because the conjugated polymer preferentially binds to and disperses s-SWCNTs in solution, it can be used to selectively separate the s-SWCNTs from a mixed carbon nanotube starting sample to provide an ultrahigh purity s-SWCNT sample. Once the sorting is completed, the depolymerization and removal of the conjugated polymer can be carried out using a mild acid, a low temperature heat treatment, or a combination of both in a procedure that does not significantly adversely affect the electric and/or optoelectric properties of the SWCNTs. As a result, the methods can be used to provide s-SWCNTs that are suitable for use in electronic devices, such as field effect transistors, and in optoelectronic devices, such as photovoltaic cells.

The methods can be used to sort and separate s-SWCNTs having a variety of diameters and bandgaps, including s-SWCNTs that are suited for electronic and/or optoelectronic applications. By way of illustration, the methods can be used to sort s-SWCNTs having diameters in the range from about 1.3 nm to about 1.7 nm. Such s-SWCNTs are useful as active materials in electronic devices, such as field effect transistors, and can be made relatively inexpensively using arc discharge techniques. Alternatively, the methods can be used to sort s-SWCNTs having diameters in the range from about 0.7 nm to about 1 nm. Such s-SWCNTs are useful as active materials in optoelectronic devices, such as photovoltaic cells, and can be made using Co—Mo catalysts (i.e., using CoMoCAT techniques).

In one embodiment of a method of sorting and separating s-SWCNTs from a starting sample containing a mixture of s-SWCNTs and m-SWCNTs, a solution including the starting sample, the conjugated polymer, and an organic solvent is formed. The organic solvent can be a single solvent or a solvent mixture in which the conjugated polymer is substantially soluble. Examples of suitable solvents include toluene, chloroform, dichloromethane, and dichlorobenzene. The conjugated polymer in the solution preferentially binds to and wraps the s-SWCNTS, relative to the m-SWCNTs. As a result, the s-SWCNTs are selectively dispersed in the solution, while the m-SWCNTs selectively fall out of the solution. Optionally, the dispersion of the s-SWCNTs can be facilitated by agitating the solution using, for example, ultrasonication. The undispersed m-SWCNTs can then be removed from the solution using, for example, centrifugation followed by filtration, leaving a purified solution that is enriched in s-SWCNTs.

The polymer coating on the s-SWCNTs can be removed by exposing the polymer-coated s-SWCNTs to a mild acid and/or a mild heat treatment in order to depolymerize the conjugated polymer. As a result, the uncoated s-SWCNTs will fall out of solution and can be collected using, for example, centrifugation and filtration. Organic acids, such as trifluoro acetic acid, are examples of acids that can be added to a solution of the polymer-coated s-SWCNTs in order to depolymerize and remove the conjugated polymer. The acid can be added directly to the initial purified solution of s-SWCNTs. Alternatively, the solvent from the initial purified solution can be removed by, for example, evaporation, and the polymer coated s-SWCNTs can be re-dispersed in a new solvent to which the acid is added. The acids should be sufficiently weak that they do not oxidize the $sp^2$ carbons on the SWCNT surface to an extent that would significantly negatively affect charge transport.

As an alternative to, or in addition to, depolymerization via acid degradation, thermal degradation can be used to depolymerize the conjugated polymer coating. For example, the polymer can be depolymerized by heating the purified solution enriched in s-SWCNTs to an elevated temperature for a sufficient time. By way of illustration only, this thermal treatment can be carried out at temperatures of 500° C., or lower, for time periods of 6 hours or less. In some embodiments, the thermal treatment is carried out at a temperature of 450° C., or lower, for a time period of 2 hours or less. For example, temperatures in the range from about 350° C. to about 450° C. can be used. When both an acid treatment and a thermal treatment are used, the polymer-coated s-SWCNTs can be exposed to the acid and the heat simultaneously or in a sequential, step-wise fashion.

Although the thermal depolymerization of the polymer wrapped s-SWCNTs is described and illustrated using PFO-N-BPy coated s-SWCNTs, the thermal treatment can also be used to remove other conjugated polymers having imine linkages along their backbone from s-SWCNTs. For example, the thermal depolymerization can be applied to other conjugated polymers comprising bipyridine repeat units and imine linkages along their backbone. In some embodiments of the methods, exposing the polymer-coated s-SWCNTs to heat, without the use of acid, is able to remove at least 50% of the polymer, by weight. This includes methods in which at least 60% by weight or at least 65% by weight of the polymer is removed using heat treatment alone. Methods of determining the percentage of polymer weight loss using TGA are described in the Example.

Figure 10:
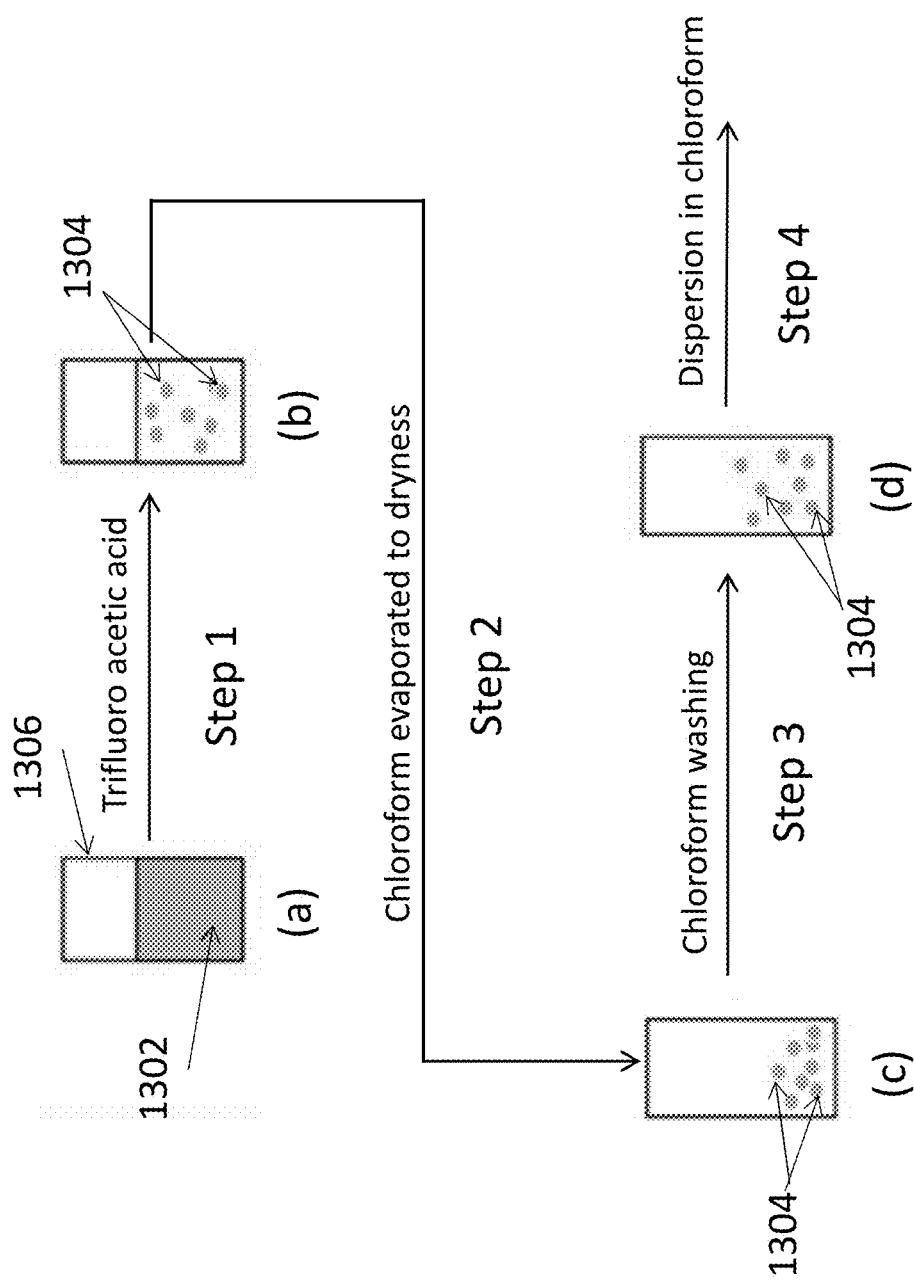
FIG. 10 depicts the removal of the polymer PFO-N-BPy from SWCNT surface in the presence of trifluoro acetic acid.

FIG. 10 is a schematic diagram of a procedure for removing the conjugated polymer from polymer-coated s-SWCNTs in solution and collecting the uncoated s-SW-CNTs. A more detailed description of the method is provided in the Example. Panel (a) in FIG. 10 depicts a purified solution 1302 that is enriched in s-SWCNTs, which are dispersed in the solution. In a first step of the process, an acid, such as trifluoro acetic acid, is added to purified solution 1302. As a result, the conjugated polymer is depolymerized and the s-SWCNTs form agglomerates 1304 (panel (b)). The solvent in the solution is then evaporated (panel (c)) and the s-SWCNTs 1304, along with the degraded polymer, collect at the bottom of container 1306. The s-SWCNTS can then be washed in an appropriate solvent, such as chloroform, one or more times (Step 3; panel (d)) to remove the degraded polymer. Finally, the s-SWCNTs can be re-dispersed in a solvent for downstream processing (Step 4). The s-SWCNT sorting process can be repeated through multiple cycles to increase the s-SWCNT yield. In addition, the monomers that are regenerated when the polymer is degraded can be separated, collected, and re-polymerized for use in subsequent cycles of the s-SW-CNT sorting process.

Notably, the conjugated polymer coatings that are composed of even relatively short chain polymers still have a high selectivity for the s-SWCNTs, relative to the m-SW-CNTs. This includes embodiments of the conjugated polymers having no more than 20, no more than 15, no more than 12, or no more than 10 repeat units (i.e., conjugated polymers for which "n" is ≤20; ≤15; ≤12; or ≤10). The use of these short chain polymers is advantageous because short chains tend to make the conjugated polymers more susceptible to depolymerization.

The procedures described here result in a highly pure sample of s-SWCNTs having a ratio of s-SWCNTs to m-SWCNTs that is substantially higher than that of the starting mixed SWCNTs sample. In some embodiments, the methods of sorting and separating s-SWCNTs provide a purified sample that contains at least 98% s-SWCNTs, based on the total number of s-SWCNTs and m-SWCNTs in the sample. This includes methods that provide a purified sample that contains at least 99% s-SWCNTs, based on the total number of s-SWCNTs and m-SWCNTs in the sample, and further includes methods that provide a purified sample that contains at least 99.5% s-SWCNTs, based on the total number of s-SWCNTs and m-SWCNTs in the sample. Methods for quantifying s-SWCNT purity can be found in Ding, J. F., et al. (2015). "A hybrid enrichment process combining conjugated polymer extraction and silica gel adsorption for high purity semiconducting single-walled carbon nanotubes (SWCNT)." *Nanoscale* 7(38): 15741-15747.

Once the s-SWCNTs have been purified and collected, they can be incorporated into active or passive layers in a variety of electronic and optoelectronic devices. For many device applications, it is advantageous for the SWCNTs to be aligned along their long axes. Using the method of floating evaporative assembly, the conjugated polymer-coated s-SWCNTs can be aligned on a substrate, prior to the removal of the conjugated polymer. Methods for depositing a film of aligned polymer-coated CNTs onto a substrate from a solution of the polymer-coated CNTs can be found in Joo et al., *Langmuir*, 2014, 30 (12), 3460-3466; U.S. Pat. No. 9,368,723; and in PCT application publication no. WO/2015123251. In these methods, a hydrophobic substrate is partially submerged in an aqueous medium and a flow of a liquid solution is applied to the surface of the aqueous medium, the liquid solution containing the PFO-N-BPy-wrapped s-SWCNTs dispersed in an organic solvent. This liquid solution spreads into a layer on the aqueous medium at an air-liquid interface and the PFO-N-BPy-wrapped s-SWCNTs from the layer are deposited as a film of aligned PFO-N-BPy-wrapped s-SWCNTs on the hydrophobic substrate, wherein the organic solvent in the layer, which is evaporating, is resupplied by a continuous or discontinuous flow of the liquid solution during the formation of the film. As the aligned PFO-N-BPy-wrapped s-SWCNTs are being deposited on the surface of the hydrophobic substrate, that substrate is withdrawn from the aqueous medium, such that a continuous or discontinuous film of aligned PFO-N-BPy-wrapped s-SWCNTs is deposited along the length of the hydrophobic substrate as it is withdrawn from the aqueous medium. As discussed in U.S. Pat. No. 9,425,405 and in PCT application publication no. WO2015123251, the resulting aligned SWCNTs can have a degree of alignment of ±20° or better (for example, ±15° or better) and a SWCNT linear packing density in the film is at least 40 single-walled carbon nanotubes/μm. Once the film has been deposited, the conjugated polymer can be removed from the aligned SWCNTs using an acid and/or heat treatment. The films of highly aligned, densely packed s-SWCNTs are suited for use in the conducting channel of a thin film field effect transistor.

Figure 14:
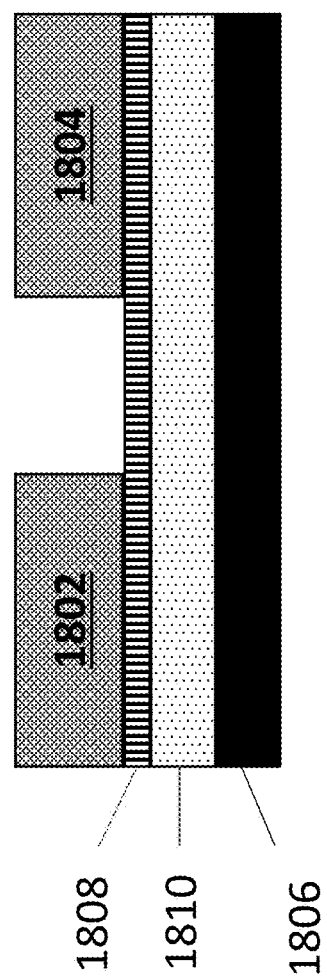
FIG. 14 is a schematic diagram of a thin film field effect transistor.

One embodiment of a field effect transistor (TFT) incorporating the sorted and aligned s-SWCNTs is shown schematically in FIG. 14. The TFT includes: a source electrode 1802; a drain electrode 1804; a gate electrode 1806; a conducting channel 1808 in electrical contact with the source electrode and the drain electrode; and a gate dielectric 1810 (e.g., silicon dioxide) disposed between the gate electrode and the conducting channel. Conducting channel 1808 comprises a film of the sorted and aligned s-SWCNTs.

EXAMPLE

This example illustrates methods for synthesizing PFO-N-BPy and for using PFO-N-BPy to separate s-SWCNTs for the starting sample containing a mixture of s-SWCNTs and m-SWCNTs.

General Procedure for the Synthesis of 2,7-Diazido-9,9-dialkyl fluorene (M1 and M3.

Figure 2:
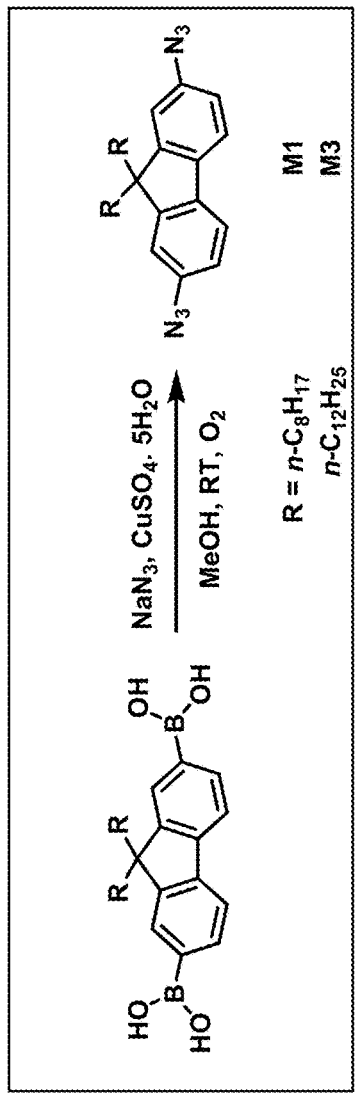
FIG. 2 depicts a general procedure for the synthesis of 2,7-diazido-9,9-dialkyl fluorene monomers having two different R groups.

FIG. 2 shows the reaction scheme for the synthesis of 2,7-diazido-9,9-dialkyl fluorene having two different R groups (R=n-$C_8H_{17}$ (M1) and R=n-$C_{12}H_{25}$ (M3)). A 100 mL round bottom flask was charged with sodium azide (2.5 mmol) and copper (II) sulfate pentahydrate (0.2 mmol). To this, methanol (8 mL) and 9,9-dialkyl-9H-fluorene-2,7-diyldiboronic acid (1.00 mmol) were added. The reaction mixture was stirred at the same temperature for 48 h. After completion of the reaction, the solvent was removed under reduced pressure and the residue was treated with petroleum ether and filtered to remove inorganic salts. The solvent was removed to give the 2,7-diazido-9,9-dialkyl-9H-fluorene as a pale yellow solid.

Synthesis of 2,2'-bipyridine-6,6'-dicarbaldehyde (M2).

Figure 3:
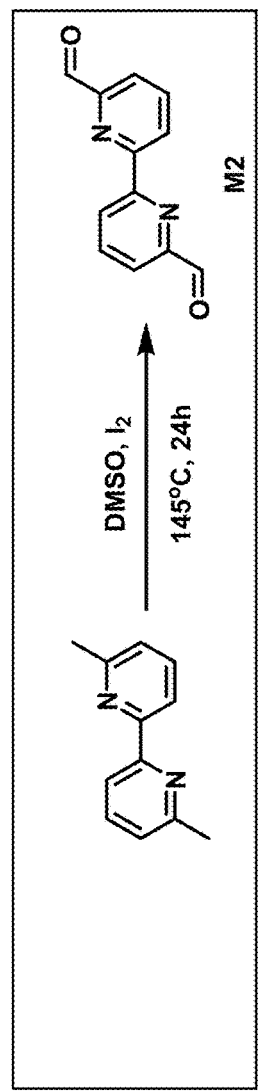
FIG. 3 depicts the synthesis of a 2,2'-bipyridine-6,6'-dicarbaldehyde monomer.

FIG. 3 shows the reaction scheme for the synthesis of 2,2'-bipyridine-6,6'-dicarbaldehyde (M2). 6,6'-dimethyl-2,2'-bipyridine (1 mmol) was dissolved in dimethyl sulfoxide (DMSO) (5 ml) and the mixture was warmed to 50° C. Iodine (2.5 mmol) in 25 mL of DMSO was slowly added to the solution. The mixture was then added to a 250 mL round bottom flask charged with 250 mL of DMSO which was preheated at 145° C. The reaction mixture was refluxed at the same temperature for 24 h, and a vigorous exothermic reaction occurred with evolution of dimethyl sulphide. After 24 h the excess iodine was quenched with saturated aqueous sodium thiosulphate solution until a pale yellow solution was obtained. Water was added to the solution to give a total volume of 250 ml and the solution was then extracted with dichloromethane (3×200 ml), washed with water (2×100 ml), dried over magnesium sulphate, and filtered. Finally, the solvent was removed on the rotary evaporator to yield a beige solid. The crude product was then crystallized by dichloromethane/petroleum ether to yield M2 as pale yellow crystals (71%).

General Procedure for the Polymerization of M2 with M1 (P1) and of M2 with M3 (P3).

FIG. 1 shows the reaction scheme for the polymerization of M2 and M1 to form conjugated polymer P1 and the polymerization of M2 with M3 to form conjugated polymer P3. An oven dried 100 mL round-bottom flask was charged with M1 (200 mg, mmol), and M2 (88 mg, mmol). This mixture was evacuated and refilled with argon, and 15 mL of freshly distilled anhydrous toluene (50 mL) were added under nitrogen atmosphere. This mixture was purged with argon for 15 min to remove dissolved oxygen, after which excess (n-Bu)$_3$P (88 mg, mmol) was added. Immediately, a dark red color was observed with an evolution of nitrogen, indicating the formation of the reactive phosphazene intermediate. This reaction mixture was heated at 80° C. for 48 h. After 48 h the reaction was cooled, the solvent was reduced to half the volume, and the product was precipitated in methanol (MeOH). Soxhlet extraction of the crude solid with hot MeOH was carried out to remove low molecular weight oligomers and other phosphine oxide by-products. The polymer was collected and dried to afford a yellow solid (200 mg, yield 65%): $^1$H NMR (400 MHz, Chloroform-d) δ 10.21 (s, 1H), 8.86 (d, J=11.0 Hz, 1H), 8.64 (d, J=7.5 Hz, 0H), 8.36 (d, J=7.0 Hz, 0H), 8.02 (s, 0H), 7.82-7.64 (m, 0H), 7.39 (s, 1H), 7.05-6.97 (m, 0H), 2.05 (s, 0H), 1.08 (s, 4H), 0.84-0.50 (m, 1H). Molecular weight GPC, Mn: 6,600 g/mol PDI: 2.01. n for P1 and P3 was 10.

Preparation of Arc Discharge CNT/PFO-N-BPy Solutions; HiPCo CNT/PFO-N-BPy Solutions; CNT/PFO-BPy Solutions; HiPCo CNT/PFO-BPy Solutions:

Large-diameter, semiconducting enriched SWCNTs were extracted from an arc discharge carbon nanotube powder (750514, Sigma-Aldrich) or a HiPCO carbon nanotube powder (Raw, NanoIntegris R1-831). A 1:1 weight ratio of 1 mg/ml of the powder and 1 mg/mL PFO-N-BPy) were dispersed in 60 ml of toluene using a horn tip sonicator (Thermo Fisher Scientific, Sonic Dismembrator 500) at 64 W power. The sonication time of the initial dispersion was 15 min. Following the initial dispersion, the SWCNT solution was centrifuged (Thermo Fisher Scientific, Sorvall WX, swing bucket rotor, TH-641) at 41 krpm for 10 min. to remove un-dispersed materials. The upper 90% of the supernatant was collected and centrifuged for an additional 30 min. at 41 krpm. The supernatant was collected and, optionally, the toluene was distilled, rendering a gel-like PFO-N-BPy SWCNT mixture. The solution was then centrifuged and dispersed with bath sonication four times in toluene to rinse off as much excess PFO-N-BPy as possible. For some polymer degradation studies, the PFO-N-BPy SWCNT mixture was then dispersed in chloroform. The final solution was prepared by horn-tip sonication of the rinsed SWCNT pellet in chloroform for a total of 30 seconds.

For comparison, solutions of the arc discharge carbon nanotubes with poly(9,9-dioctylfluorene-2,7-diyl-co-bipyrine) (PFO-BPy) (American Dye Source, Inc., Mw. 48 k), which lacks a backbone imine linkage, were also prepared using the same procedure described above.

Comparison of s-SWCNT Sorting: PFO-N-BPy Vs. PFO-BPy.

Figure 4:
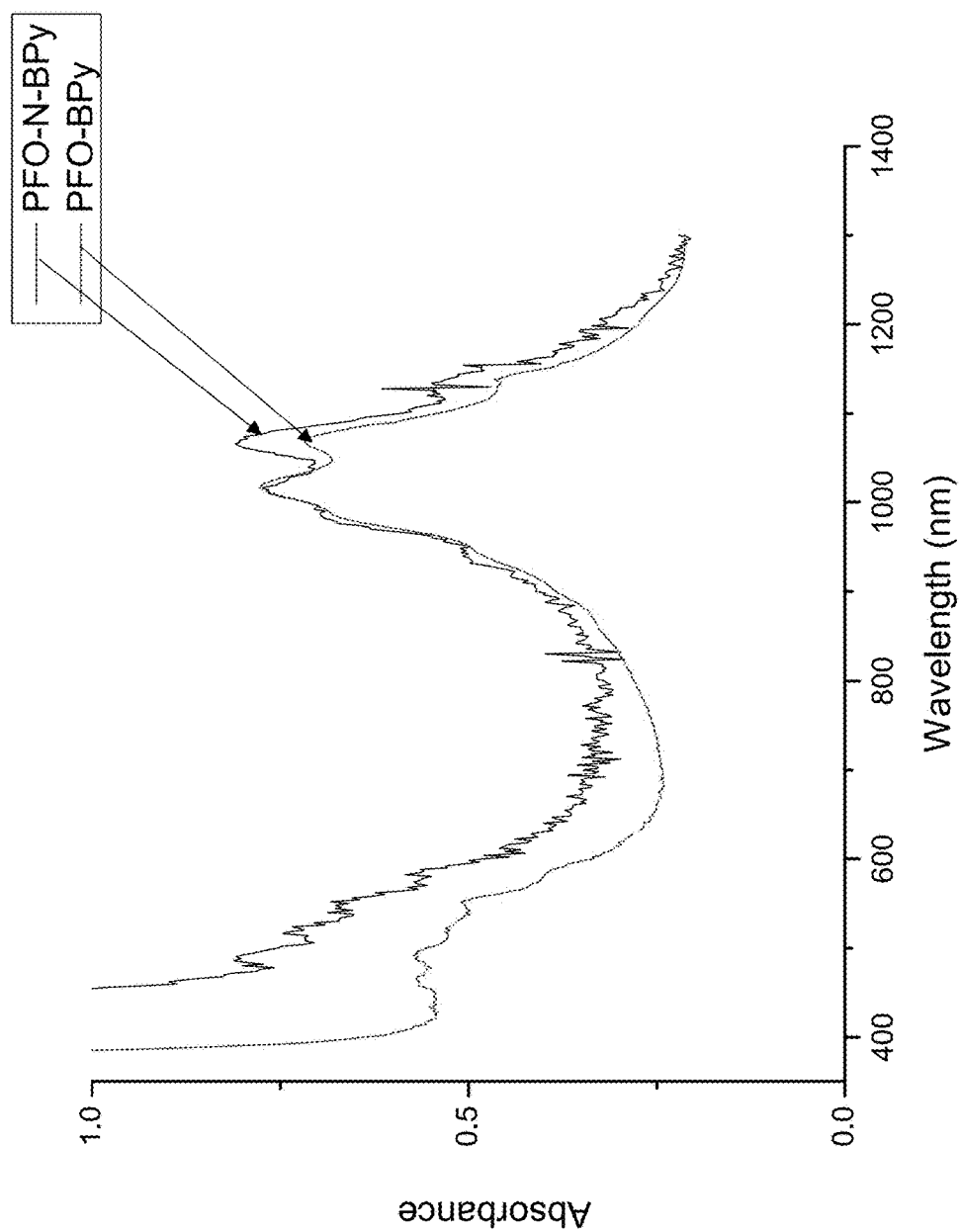
FIG. 4 depicts the absorbance spectra for solutions of arc discharge (Arc-D) s-SWCNTs wrapped with PFO-N-BPy in toluene and with PFO-BPy in toluene.
Figure 5:
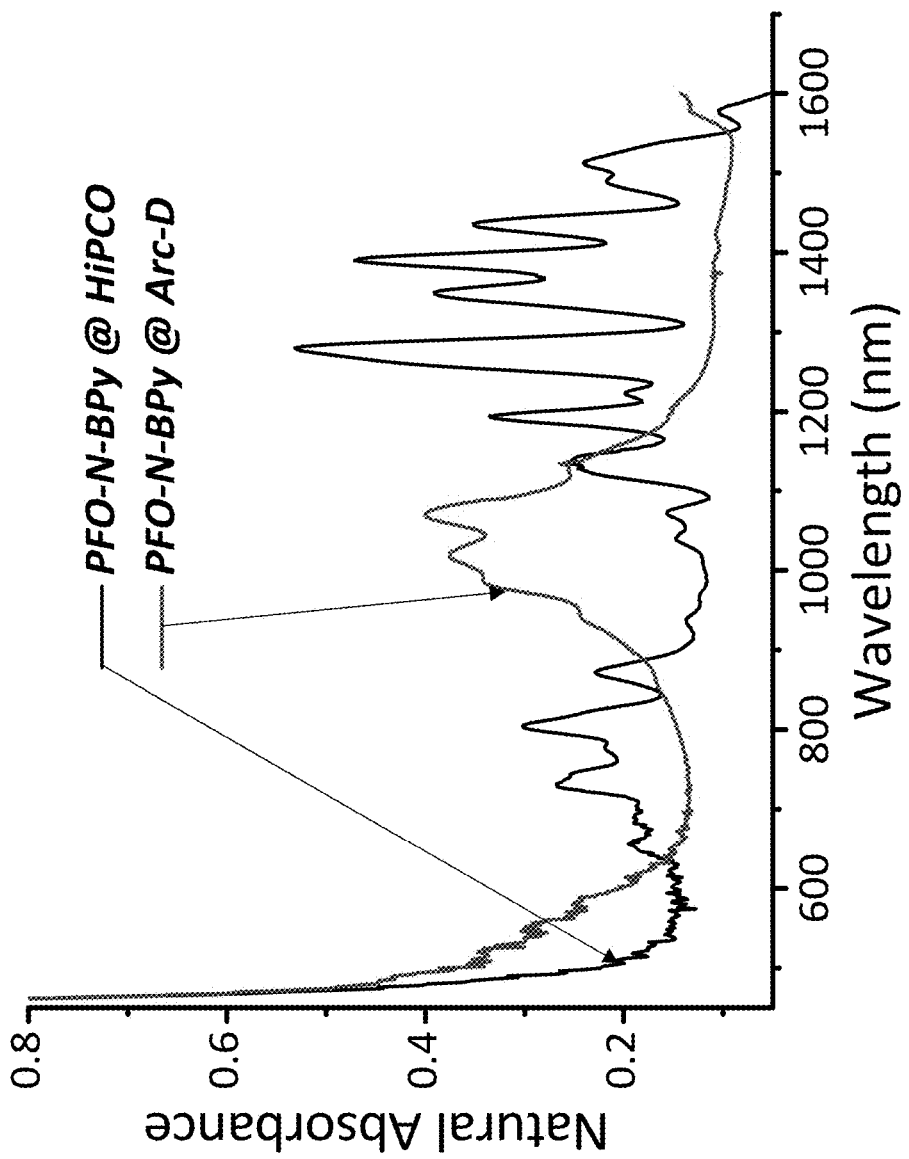
FIG. 5 depicts UV-Vis-NIR spectra of PFO-N-BPy (P1)-sorted Arc-D and HiPCo SWCNTs in toluene.

Absorption spectra of PFO-N-BPy- and PFO-BPy-sorted arc discharge SWCNTs in toluene (FIG. 4) were similar, indicating selectivity for similar diameter SWCNTs. S22 and S33 peaks are the second and third energy transitions of semiconducting SWCNTs that were broadened due to an overlap of a wide diameter distribution and M11 peaks were absent in the sorted spectra because of significant removal of metallic impurities. FIG. 5 shows the absorption spectra of PFO-N-BPy-sorted HiPCo and arc-discharge SWCNTs in toluene.

Acid Degradation (Depolymerization) Studies of PFO-N-BPy.

Figure 6:
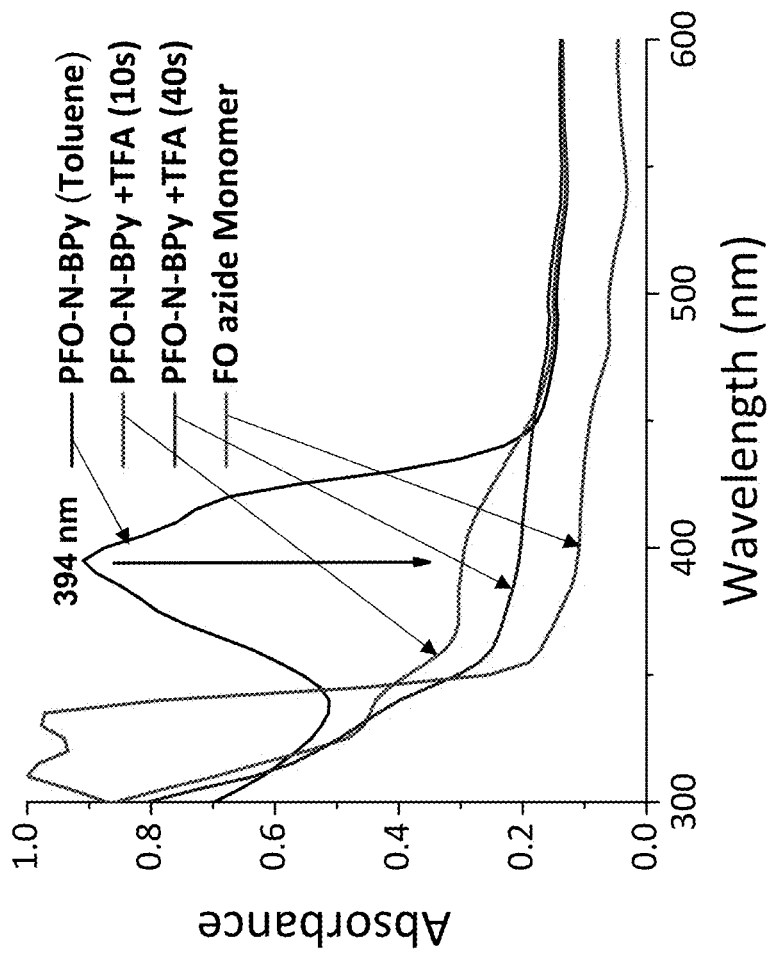
FIG. 6 depicts absorbance spectra indicating the solution acid degradation of PFO-N-BPy (P1) with trifluoro acetic acid in toluene.
Figure 7:
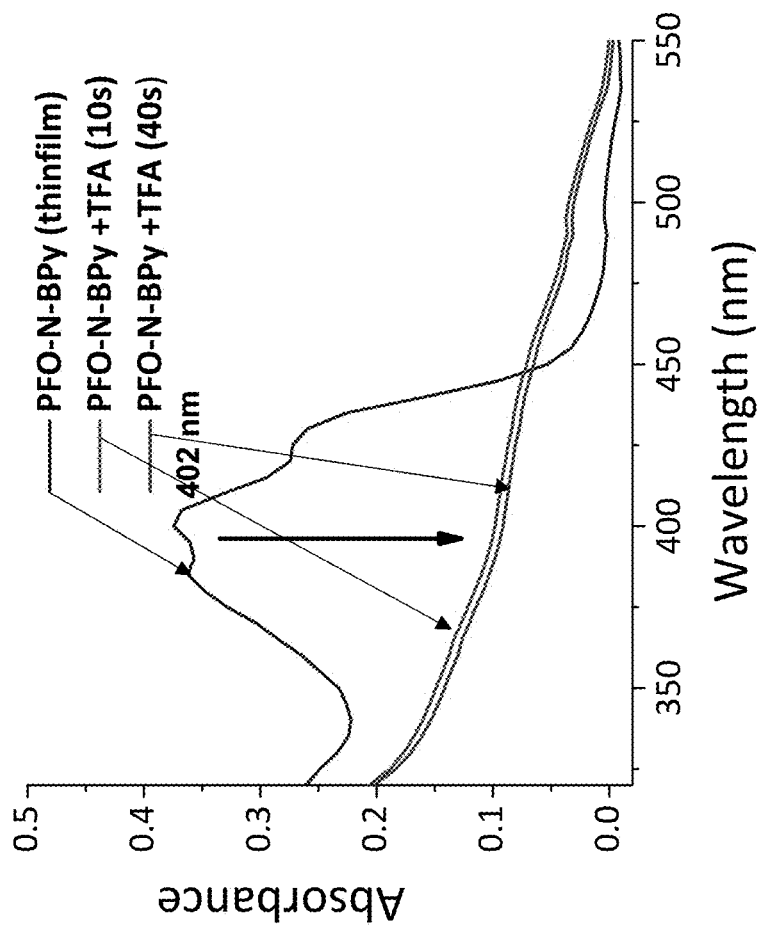
FIG. 7 depicts absorbance spectra indicating the thin film acid degradation of PFO-N-BPy (P1) with trifluoro acetic acid.

Degradation of PFO-N-BPy to remove the polymer from the SWCNT surfaces was studied in solution and in a thin-film in the presence of an aqueous solution of trifluoroacetic acid in toluene (TFA, 0.1% v/v). The trifluoroacetic acid in toluene (TFA, 0.1% v/v) and a drop of water were added to the polymer wrapped SWCNTs in toluene. Polymer degradation was monitored by the disappearance of the maximum absorption peak at 394 nm in solution and at 402 nm in thin film studies. FIG. 6 and FIG. 7 show the absorbance spectra for the PFO-N-BPy solution and PFO-N-BPy thin-film, respectively, before the addition of the TFA and at 10 s and 40 s after the addition of the TFA. Post TFA treatment, the solution absorption spectra showed only the monomer absorption peaks at 320 and 280 nm, which confirmed quantitative degradation of PFO-N-BPy in solution.

Figure 11:
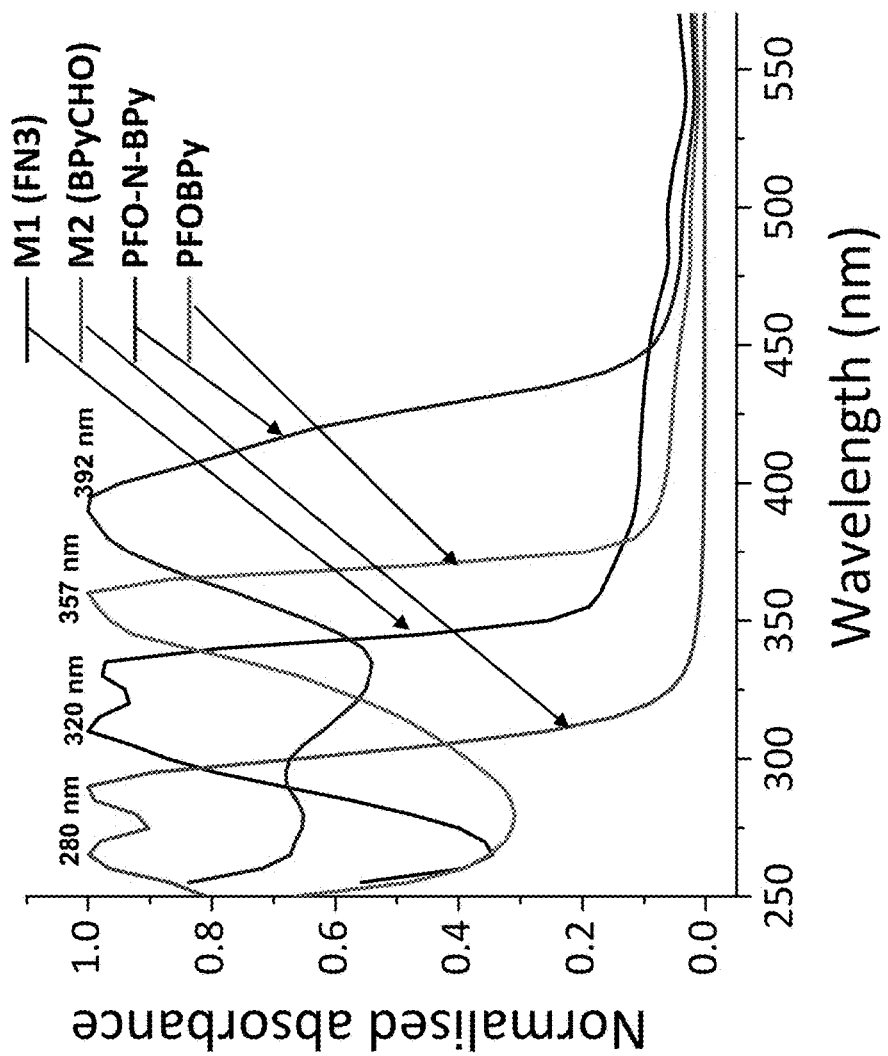
FIG. 11 depicts UV-Vis absorption spectra of M1 monomer, M2 monomer, and a PFO-N-BPy polymer in chloroform.
Figure 12:
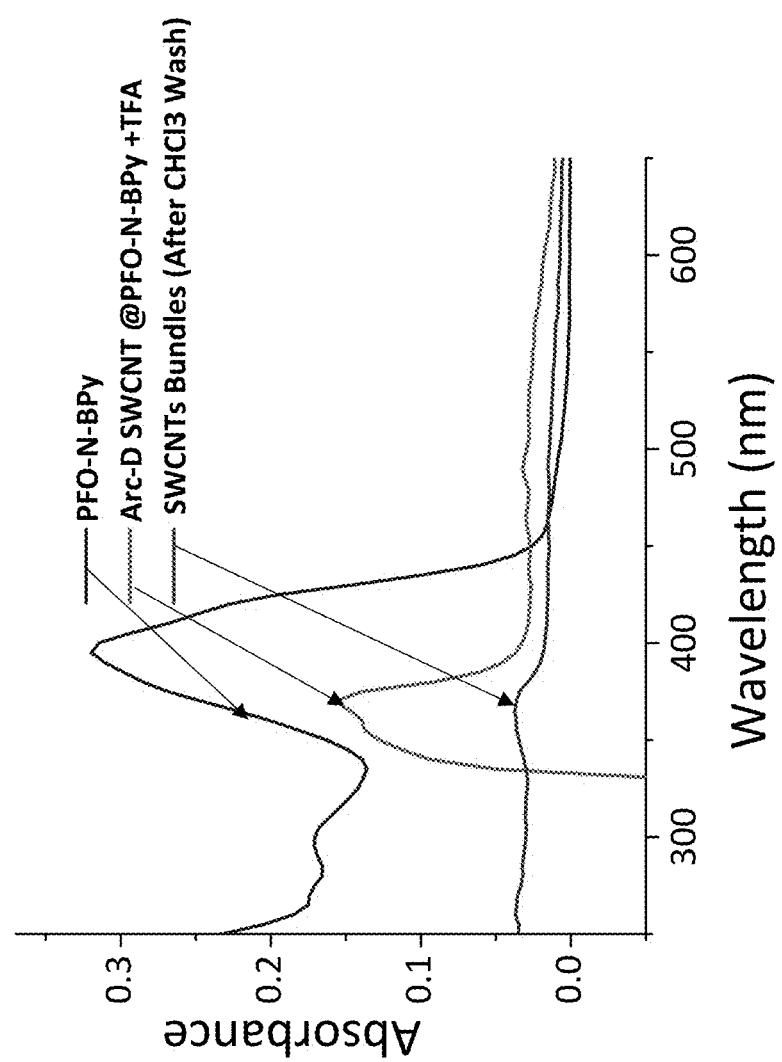
FIG. 12 depicts absorbance spectra indicating the removal of PFO-N-BPy from the Arc-D SWCNT surface in the presence of trifluoro acetic acid (TFA).

Degradation of PFO-N-BPy to remove the polymer from the SWCNT surfaces was also studied in solution and in a thin-film in the presence of an aqueous solution of trifluoroacetic acid in chloroform using the process illustrated in FIG. 10. FIG. 11 shows the absorbance spectra of the M1 monomer, the M2 monomer, the PFO-N-BPy polymer, and the PFO-BPy polymer. FIG. 12 shows the absorbance spectra for the PFO-N-BPy polymer, for a solution of the PFO-N-BPy wrapped SWCNTs with TFA in chloroform, and for the SWCNTs after polymer removal and washing the solution with chloroform to remove the residual monomers generated after polymer degradation. Polymer degradation was monitored by the disappearance of absorption peak at 392 nm.

Thermal Degradation (Depolymerization) Studies of PFO-N-BPy and PFO-BPy.

Figure 8:
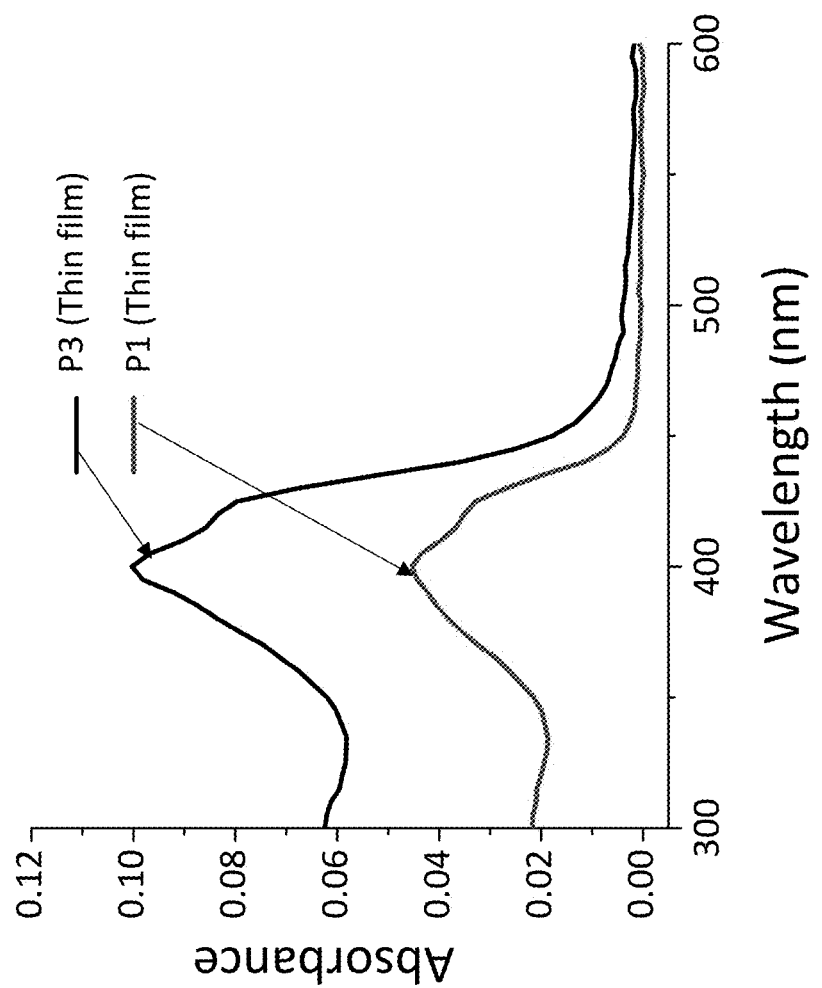
FIG. 8 depicts the thin film UV-Vis spectra of PFO-N-BPy (P1 & P3) before thermal annealing.
Figure 9:
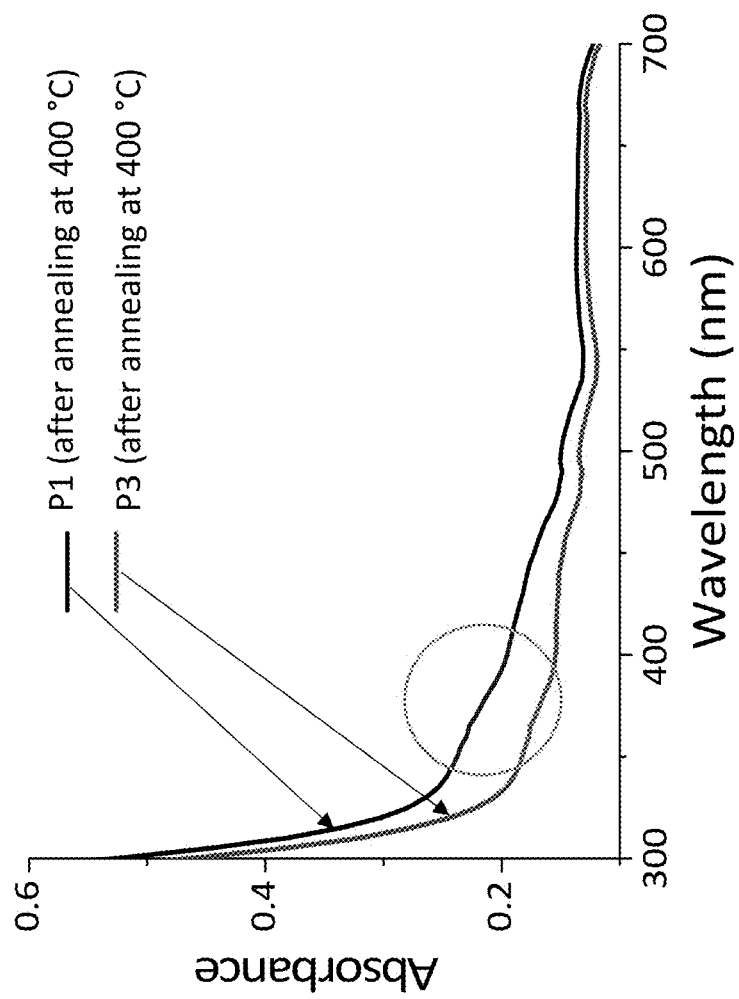
FIG. 9 depicts the thin film UV-Vis spectra of PFO-N-BPy (P1 & P3) after thermal annealing at 400° C. for 1 h under vacuum.
Figure 13:
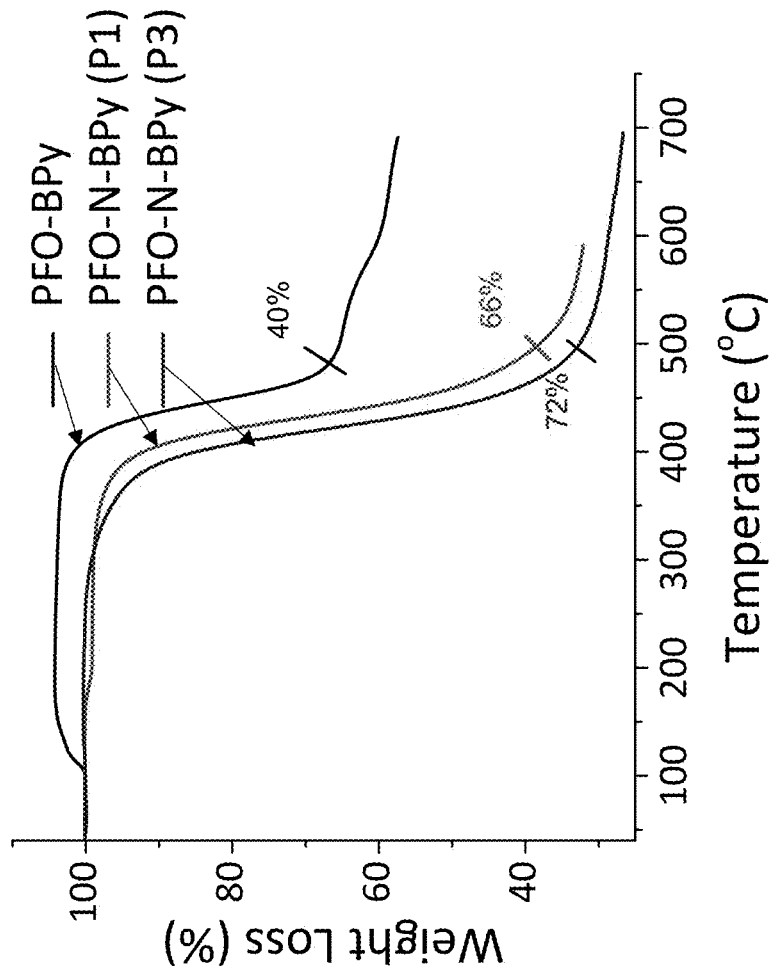
FIG. 13 depicts the thermal gravimetric analysis (TGA) weight loss curves for PFO-BPy, PFO-N-BPy (P1), and PFO-N-BPy (P3).

Thermal properties of PFO-N-BPy (P1 and P3) and PFO-BPy were studied by thermogravimetric analysis (TGA) and differential scanning calorimetry (DSC). In the TGA measurements, a single step decomposition was typically observed in the course of ramping up the temperature for all three polymers, as shown in the weigh loss graph of FIG. 13. PFO-N-BPy polymers exhibited lower decomposition temperatures ($T_d$=360° C. for P1 and $T_d$=345° C. for P3) and ~25% more weight loss when compared to its non-degradable polymer analog PFO-BPy ($T_d$=385° C.). The weight loss of ~40% observed for the PFO-BPy polymer is equivalent to the weight of alkyl side chains, but for the PFO-N-BPy polymers the greater weight loss of 65% for P1 and 72% for P3 can be attributed to the simultaneous decomposition of the side chains and the polymer conjugated backbone. This shows that the PFO-N-BPy polymers were thermally more labile than the PFO-BPy polymer. A higher glass transition temperature ($T_g$) was observed for PFO-N-BPy (145° C.-155° C.) with only a few polymer repeating units (n=10-20), which is 25-35° C. greater than that of the non-degradable polymer PFO-BPy with more than 100 repeating units. The thermal degradation of PFO-N-BPy was also studied by annealing the polymer thin films drop casted on glass substrates at 400° C. under vacuum, followed by rinsing with chloroform. Polymer degradation was monitored by the disappearance of the maximum absorption peak at 402 nm. FIG. 8 shows the absorbance spectra of the P1 and P3 thin films prior to annealing. FIG. 9 shows the absorbance spectra of the P1 and P3 thin films after annealing. The data indicate that thermal annealing of the thin-film can remove a majority (>95%) of the polymer. Hence this new polymer can be degraded by mild acid as well as a thermal process.

TABLE 1

| Polymer | Mn (Kg/mol) | PDI | DPn | Solution $\lambda_{max}$ (nm) | $E_g$ (eV) | $T_d$ (° C.) (Under $N_2$) | Weight loss (%) (Under $N_2$) | $T_g$ (° C.) |
|---|---|---|---|---|---|---|---|---|
| PFO-BPy | 50 | ~2 | 100 | 355 | 3.2 | 382 | 40 | 117 |
| PFO-N-BPy (P1) | 7 | 2.01 | 11 | 394 | 2.73 | 360 | 66 | 145 |
| PFO-N-BPy (P3) | 15 | 2.02 | 20 | 400 | 2.73 | 345 | 72 | 155 |

PDI = polydispersity index;
DPn = degree of polymerization.

FET Device Fabrication and Measurement.

Figure 15:
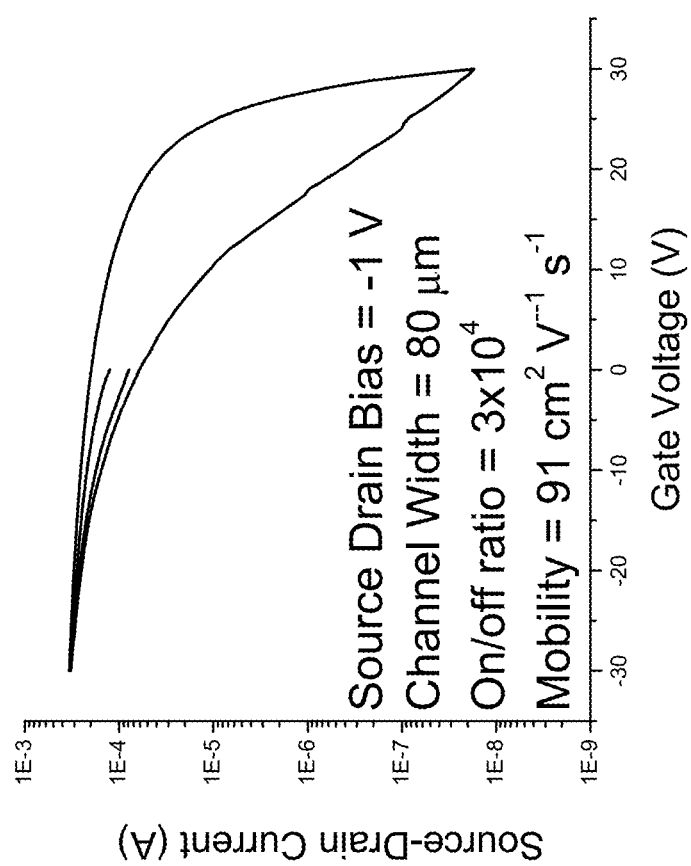
FIG. 15 shows the transfer characteristics of a thin film transistor.
Figure 16:
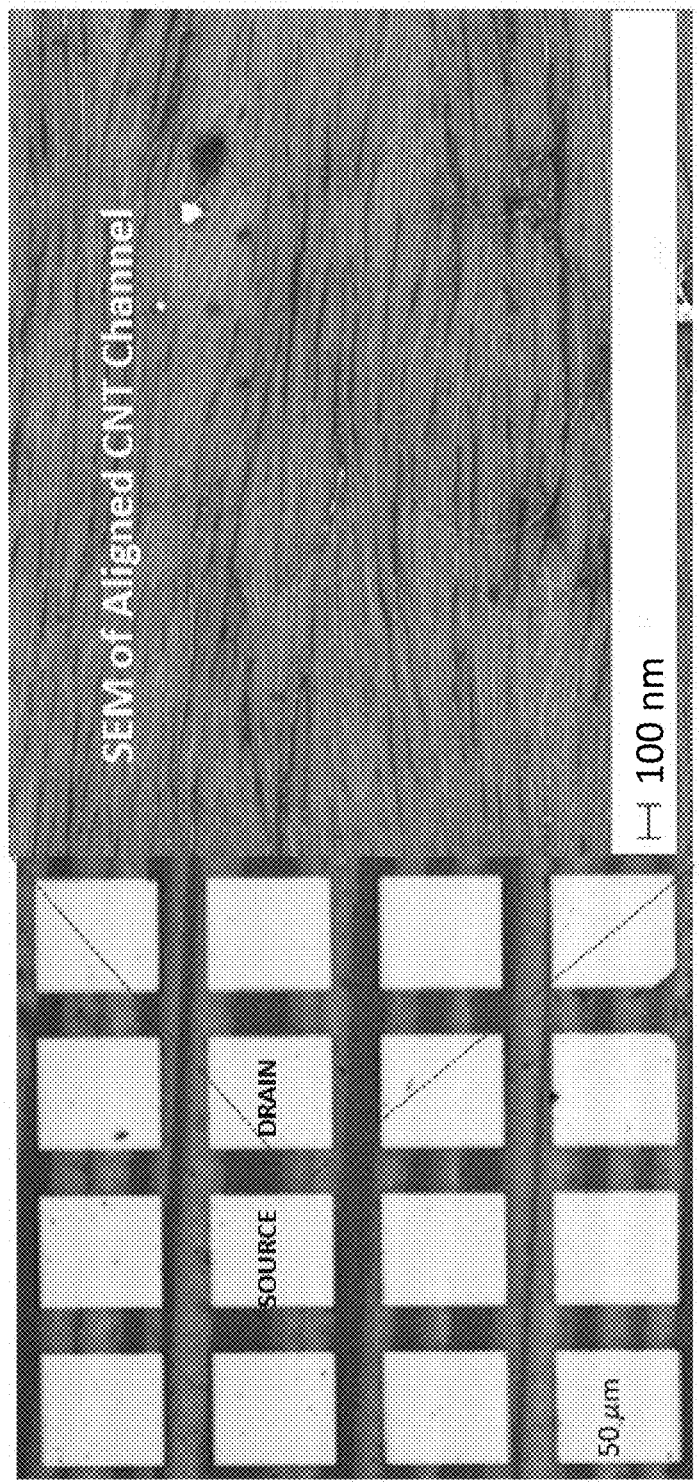
FIG. 16 shows a scanning electron microscope image (SEM) of a thin film transistor (left panel), with an enlarged view of a portion of the channel region (right panel) showing a plurality of aligned s-SWCNTs.
Figure 17:
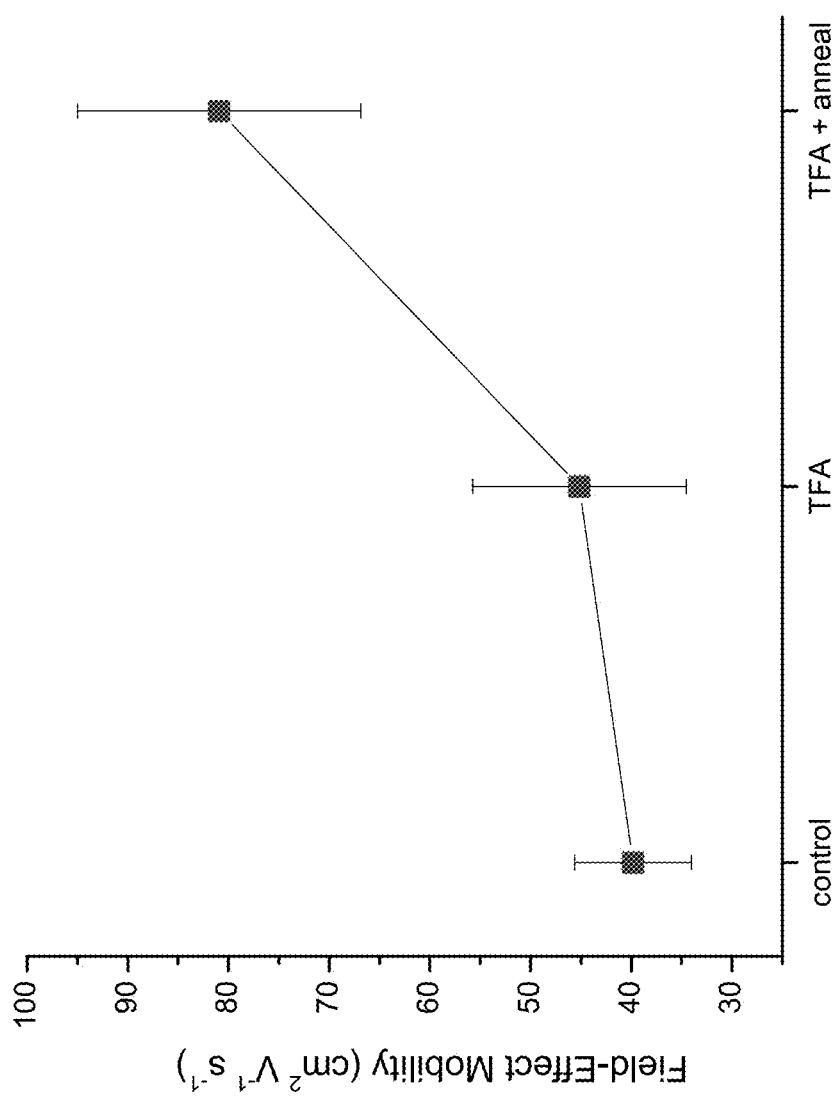
FIG. 17 depicts a graph showing effect of PFO-N-BPy removal on the charge transport of a s-SWCNT film.

FETs incorporating films of aligned s-SWCNTs as channel layers were fabricated. The aligned s-SWCNT films and the FET components were formed using the CNT film formation methods discussed in Joo et al., *Langmuir*, 2014, 30 (12), 3460-3466; U.S. Pat. No. 9,368,723; and in PCT application publication no. WO/201512325. The SWCNTs were deposited on top of a 90 nm thick, thermally-grown $SiO_2$ dielectric on top of a low-resistivity Si substrate, which acted as the gate dielectric and gate electrode, respectively. In one FET, the polymer-wrapped s-SWCNTs were used in the conducting channel without removing the conjugated polymer wrapping. In the other FETs, prior to fabrication of source-drain contacts, the films underwent one of two different treatments to remove the conjugated polymer from the SWCNT surfaces: (i) mild acid rinse using TFA in toluene solvent (0.2% W:W) and 1 min. incubation; and (ii) a combination of (i) followed by thermal annealing at 400° C. in vacuum. Following the formation of the s-SWCNT films, with or without a polymer removal treatment, 30 nm thick Pd source-drain electrodes were deposited via shadow mask lithography. FIG. 16 shows a cross-polarized optical micrograph image of an FET made using the mild acid rinse followed by the thermal annealing (left panel), with an SEM image of the aligned s-SWCNT channel (right panel). Current-voltage (I-V) measurements were taken in ambient air, and mobility values were extracted from the linear region of the current vs. gate voltage (swept -30 to 30 V) characteristics, which were measured at a constant source-drain bias (-1 V). FIG. 15 shows the I-V curves for the FET made using the mild acid rinse followed by the thermal annealing. FIG. 17 shows that the field-effect mobility for the three FETs increased with sequential surface treatments.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A conjugated polymer having the structure:

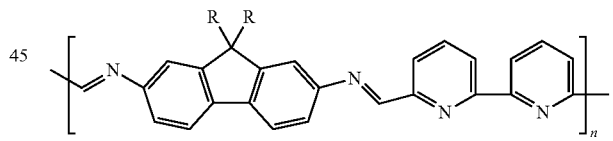

where R represents a functional group comprising an alkyl chain and n represents the number of repeat units in the conjugated polymer.

2. The conjugated polymer of claim 1, wherein R has the structure: $C_xH_{(2x+1)}$, where x is in the range from 6 to 30.

3. Polymer-wrapped semiconducting single-walled carbon nanotubes comprising semiconducting single-walled carbon nanotubes coated by a conjugated polymer having the structure:

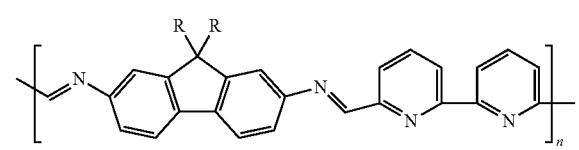

where R represents a functional group comprising an alkyl chain and n represents the number of repeat units in the conjugated polymer.

4. The polymer-wrapped semiconducting single-walled carbon nanotubes of claim 3, wherein n has a value of 15 or lower.

5. The polymer-wrapped semiconducting single-walled carbon nanotubes of claim 3, wherein R has the structure: $C_xH_{(2x+1)}$, where x is in the range from 6 to 20.

6. A method of separating semiconducting single-walled carbon nanotubes from a starting carbon nanotube sample comprising a mixture of semiconducting single-walled carbon nanotubes and metallic single-walled carbon nanotubes, the method comprising:
   forming a solution comprising the carbon nanotube sample and a conjugated polymer having the structure:

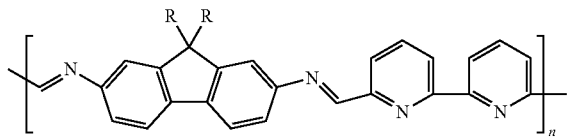

where R represents a functional group comprising an alkyl chain and n represents the number of repeat units in the conjugated polymer, wherein the conjugated polymer preferentially coats and disperses the semiconducting single-walled carbon nanotubes, relative to the metallic single-walled carbon nanotubes, in the solution; and
   separating the dispersed single-walled carbon nanotubes from the undispersed single-walled carbon nanotubes to obtain a purified carbon nanotube sample, wherein the purified carbon nanotube sample has a higher ratio of semiconducting single-walled carbon nanotubes to metallic single-walled carbon nanotubes than did the starting carbon nanotube sample.

7. The method of claim 6, wherein n has a value of 15 or lower.

8. The method of claim 6, wherein n has a value of 10 or lower.

9. The method of claim 6, wherein the purified carbon nanotube sample comprises at least 99% semiconducting single-walled carbon nanotubes, based on the total number of semiconducting single-walled carbon nanotubes and metallic single-walled carbon nanotubes.

10. The method of claim 6, further comprising removing the coating of the conjugated polymer from the semiconducting single-walled carbon nanotubes in the purified carbon nanotube sample.

11. The method of claim 10, wherein removing the coating of the conjugated polymer from the semiconducting single-walled carbon nanotubes comprises depolymerizing the conjugated polymer with acid, heat, or a combination of acid and heat.

12. The method of claim 11, wherein removing the coating of the conjugated polymer from the semiconducting single-walled carbon nanotubes comprises depolymerizing the conjugated polymer with acid.

13. The method of claim 11, wherein removing the coating of the conjugated polymer from the semiconducting single-walled carbon nanotubes comprises depolymerizing the conjugated polymer with heat.

14. The method of claim 6, where R has the structure: $C_xH_{(2x+1)}$, where x is in the range from 6 to 20.

15. A method of separating semiconducting single-walled carbon nanotubes from a starting carbon nanotube sample comprising a mixture of semiconducting single-walled carbon nanotubes and metallic single-walled carbon nanotubes, the method comprising:
   forming a solution comprising the carbon nanotube sample and a conjugated polymer having imine linkages along its polymer backbone chain, wherein the conjugated polymer preferentially coats and disperses the semiconducting single-walled carbon nanotubes, relative to the metallic single-walled carbon nanotubes, in the solution;
   separating the dispersed single-walled carbon nanotubes from the undispersed single-walled carbon nanotubes to obtain a purified carbon nanotube sample, wherein the purified carbon nanotube sample has a higher ratio of semiconducting single-walled carbon nanotubes to metallic single-walled carbon nanotubes than did the starting carbon nanotube sample; and
   heating the conjugated polymer-coated semiconducting single-walled carbon nanotubes to a temperature at which the backbone of the conjugated polymer thermally decomposes, whereby at least 60 percent, by weight, of the coating of the conjugated polymer is removed from the semiconducting single-walled carbon nanotubes.

16. The method of claim 15, wherein the thermal decomposition of the conjugated polymer is carried out in the absence of acid.

17. The method of claim 15, wherein the thermal decomposition of the conjugated polymer is carried out at a temperature in range from 300° C. to 500° C.

* * * * *